(12) United States Patent
Tseng et al.

(10) Patent No.: US 12,253,541 B2
(45) Date of Patent: Mar. 18, 2025

(54) POGO PIN COOLING SYSTEM AND METHOD AND ELECTRONIC DEVICE TESTING APPARATUS HAVING THE SYSTEM

(71) Applicant: CHROMA ATE INC., Taoyuan (TW)

(72) Inventors: I-Shih Tseng, Taoyuan (TW); Xin-Yi Wu, Taoyuan (TW); I-Ching Tsai, Taoyuan (TW); Chin-Yi Ouyang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 105 days.

(21) Appl. No.: 18/050,500

(22) Filed: Oct. 28, 2022

(65) Prior Publication Data
US 2024/0142492 A1 May 2, 2024

(51) Int. Cl.
*G01R 1/04* (2006.01)
*G01R 31/28* (2006.01)

(52) U.S. Cl.
CPC ........ *G01R 1/0466* (2013.01); *G01R 31/2877* (2013.01)

(58) Field of Classification Search
CPC .................... G01R 31/2877; G01R 1/0466
See application file for complete search history.

(56) References Cited

U.S. PATENT DOCUMENTS

| | | | | |
|---|---|---|---|---|
| 6,972,581 B2 * | 12/2005 | Yamashita | .......... | G01R 31/2874 324/756.05 |
| 7,932,480 B2 * | 4/2011 | Gu | .............. | H05B 1/0244 219/486 |
| 2002/0109518 A1 * | 8/2002 | Saito | ............. | G01R 31/2877 324/750.09 |
| 2003/0123225 A1 * | 7/2003 | Miller | ............ | H05K 7/20236 257/714 |
| 2004/0077200 A1 * | 4/2004 | Ishikawa | ........ | G01R 31/01 439/190 |
| 2005/0225346 A1 * | 10/2005 | Saito | ............ | G01R 31/2877 324/757.01 |
| 2007/0007983 A1 * | 1/2007 | Salmon | .......... | G01R 1/07357 324/750.08 |

(Continued)

FOREIGN PATENT DOCUMENTS

| | | | | |
|---|---|---|---|---|
| JP | 2002236140 A | * | 8/2002 | .......... G01R 1/0458 |
| WO | WO-0246781 A1 | * | 6/2002 | .......... G01R 1/0458 |
| WO | WO-2023084613 A1 | * | 5/2023 | |

OTHER PUBLICATIONS

Translation of JP2002236140A (Year: 2002).*

*Primary Examiner* — Paresh Patel
(74) *Attorney, Agent, or Firm* — McClure, Qualey & Rodack, LLP

(57) ABSTRACT

The present invention relates to a pogo pin cooling system and a pogo pin cooling method and an electronic device testing apparatus having the system. The system mainly comprises a coolant circulation module, which includes a coolant supply channel communicated with an inlet of a chip socket and a coolant recovery channel communicated with an outlet of the chip socket. When an electronic device is accommodated in the chip socket, the coolant circulation module supplies a coolant into the chip socket through the coolant supply channel and the inlet, and the coolant passes through the pogo pins and then flows into the coolant recovery channel through the outlet.

8 Claims, 6 Drawing Sheets

(56) References Cited

U.S. PATENT DOCUMENTS

| | | | | |
|---|---|---|---|---|
| 2011/0069453 A1* | 3/2011 | Campbell | ............... | H05K 7/203 |
| | | | | 361/700 |
| 2016/0091559 A1* | 3/2016 | Teoh | ................... | G01R 31/2875 |
| | | | | 324/750.05 |
| 2020/0371158 A1* | 11/2020 | Kato | ..................... | G01R 1/0466 |
| 2023/0099805 A1* | 3/2023 | Zhou | .................. | G01R 31/2877 |
| | | | | 324/756.02 |
| 2023/0314500 A1* | 10/2023 | Kikuchi | ............. | G01R 31/2874 |
| 2023/0400506 A1* | 12/2023 | Ouyang | ............. | G01R 31/2874 |

* cited by examiner

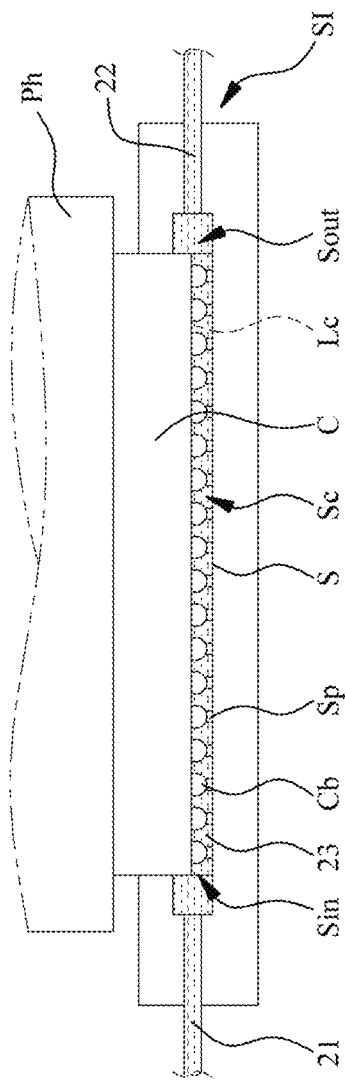
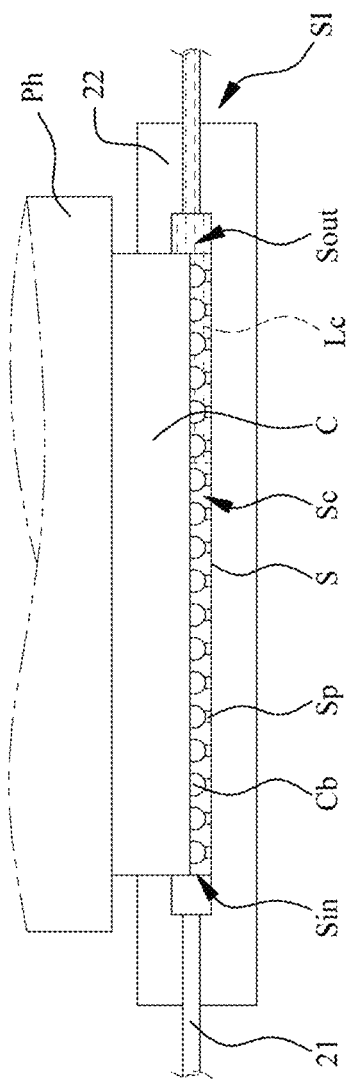
FIG. 2A
FIG. 2B

POGO PIN COOLING SYSTEM AND METHOD AND ELECTRONIC DEVICE TESTING APPARATUS HAVING THE SYSTEM

BACKGROUND OF THE INVENTION

Field of the Invention

The present invention relates to a system and method suitable for cooling a plurality of pogo pins of a testing apparatus during execution of a test of an electronic device, and an electronic device testing apparatus having the system.

Description of the Related Art

In order to ensure quality of electronic devices, the electronic devices must be tested prior to factory shipment. In the case of testing a chip, the chip is first placed into a test socket in which a plurality of pogo pins are provided in the bottom, and the test is initiated after the solder balls on the lower surface of the chip are electrically contacted with the plurality of pogo pins.

However, as the latest chip layout design has more functions and more complex processing or computing operations, the chip has more contacts on its lower surface, and the number of pogo pins in the test socket has to be increased accordingly. With the advancement of the semiconductor manufacturing process, the volume of the chip is getting smaller, and the density of the pogo pins in the test socket is also getting higher. Due to the increasingly complex functions, time necessary for execution of the test is getting longer, and power applied to the chip is getting higher. Accordingly, great heat generated when the chip is tested is directly conducted to the solder balls of the chip and the pogo pins.

Generally, the melting point of the solder balls is 180° C., but the solder balls begin to be softened gradually when the solder balls are heated to 120° C. On the other hand, when power applied to the chip by the testing apparatus upon execution of the test reaches 900 W to 1000 W, the solder balls would be heated to 120° C. However, power applied to the chip having complex functions by the testing apparatus often reaches 800 W to 2600 W. Therefore, during execution of the test, the solder balls are often melted and stuck to the pogo pins, or solder scraps remain in the test socket. After a period of time, it may lead to failure of the test, and it may lead to short circuits at worst, resulting in damage of the chip or failure of the testing apparatus.

SUMMARY OF THE INVENTION

The main object of the present invention is to provide a pogo pin cooling system, a pogo pin cooling method and an electronic device testing apparatus having the system, capable of cooling a plurality of pogo pins in a test socket and a plurality of solder ball contacts of an electronic device and of preventing solder balls from being melted.

To achieve the above object, the present invention provides a pogo pin cooling system, which is used for cooling a plurality of pogo pins in a chip socket, the chip socket comprising at least one inlet and at least one outlet. The system mainly comprises a coolant circulation module, including at least one coolant supply channel, at least one coolant recovery channel and a coolant, wherein the coolant supply channel is communicated with the inlet, and the coolant recovery channel is communicated with the outlet, and wherein when an electronic device is accommodated in the chip socket, the coolant circulation module supplies the coolant into the chip socket through the coolant supply channel and the inlet, and the coolant passes through the pogo pins and then flows into the coolant recovery channel through the outlet.

In other words, the present invention mainly utilizes the circulating coolant to cool not only the pogo pins in the chip socket but also the lower surface of the electronic device and the solder ball contacts on the lower surface. In this way, the pogo pins and the solder balls at a high temperature can be cooled during execution of the test so as to prevent the solder balls from being softened or even melted due to the high temperature and hence prevent the pogo pins and the chip socket from being contaminated. Also, the electronic device can be cooled and maintained at the test temperature.

The system of the present invention may further comprise a gas supply module, which is communicated with the inlet of the chip socket. When the coolant circulation module stops supplying the coolant, the gas supply module supplies a purge gas into the chip socket through the inlet to urge the coolant to the at least one coolant recovery channel. In other words, when the test is completed and the supply of the coolant to the chip socket is stopped, the present invention utilizes the gas supply module to remove the coolant remaining in the chip socket or on the electronic device so as to keep the electronic device and the chip socket clean and dry and recycle the residual coolant for reuse.

To achieve the above object, the present invention provides an electronic device testing apparatus, which comprises the above mentioned pogo pin cooling system and a main controller. The main controller is electrically connected to the coolant circulation module and controls the coolant circulation module to supply the coolant into the chip socket. Accordingly, the present invention can achieve full automatic operation by means of the main controller and significantly improve the test efficiency.

To achieve the above object, the present invention provides a pogo pin cooling method, comprising the steps of: placing an electronic device into a chip socket, a bottom surface of the chip socket including at least one pogo pin; supplying a coolant into the chip socket through at least one coolant supply channel so that the coolant passes through the at least one pogo pin and then flows into at least one coolant recovery channel; and stopping supplying the coolant into the chip socket.

Therefore, the pogo pin cooling method provided by the present invention cools the pogo pins in the chip socket and the solder balls of the electronic device in a liquid cooling manner by circulating the coolant. Furthermore, a closed cooling space formed by placing the electronic device into the chip socket, the coolant supply channel and the coolant recovery channel form a closed loop cooperatively so that the coolant is circulated continuously to improve the cooling effect.

Moreover, in the present invention, after the supply of the coolant is stopped, a purge gas can be supplied into the chip socket by means of a gas supply module to urge the coolant to the coolant recovery channel. That is to say, a high pressure gas can be supplied by means of the gas supply module for forcing the coolant remaining in the cooling space into the coolant recovery channel and for effectively preventing the coolant from contaminating the electronic device and chip socket.

BRIEF DESCRIPTION OF THE DRAWINGS

FIG. 2A is a schematic diagram showing supplying of a coolant according to a preferred embodiment of the present invention.

FIG. 2B is a schematic diagram showing supplying of a purge gas according to a preferred embodiment of the present invention.

DESCRIPTION OF THE PREFERRED EMBODIMENTS

Figure 1:
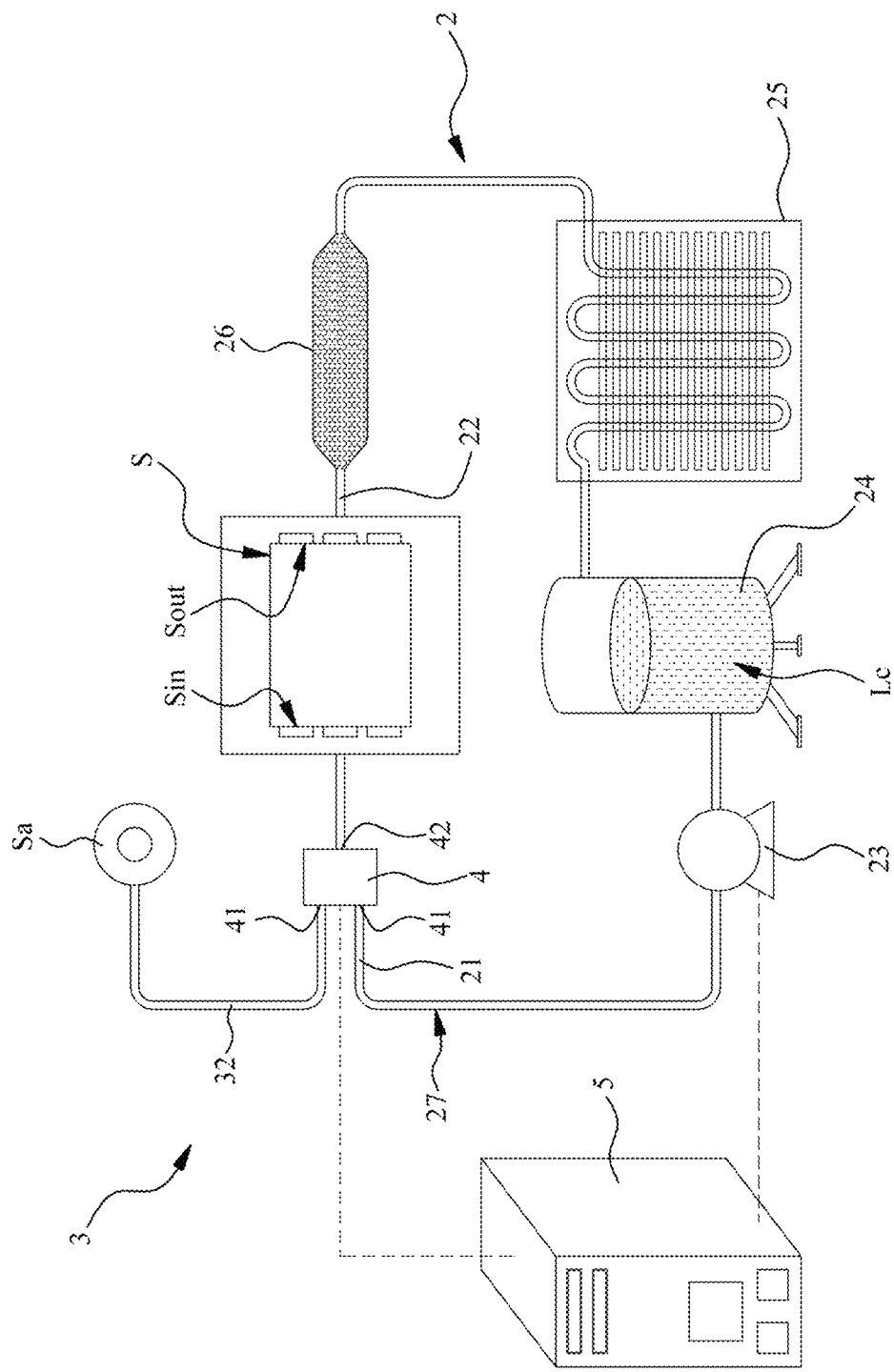
FIG. 1 is a schematic diagram of a pogo pin cooling system of the present invention.

Before a pogo pin cooling system, a pogo pin cooling method, and an electronic device testing apparatus having the system according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings. The testing apparatus to which the present invention is applied includes, but is not limited to, a semiconductor chip testing apparatus, a system-level automatic testing apparatus and the like.

Reference is made to FIG. 1, which is a schematic diagram of the pogo pin cooling system of the present invention. As shown in the figure, the pogo pin cooling system of the present embodiment is mainly used to cool a plurality of pogo pins Sp in a chip socket S of a test socket and a plurality of solder ball contacts of an electronic component C (see FIG. 2), wherein the chip socket S includes a plurality of inlets Sin and a plurality of outlets Sout. The pogo pin cooling system of this embodiment mainly includes a coolant circulation module 2, a gas supply module 3, a switch module 4 and a main controller 5. The coolant circulation module 2 further includes a coolant supply channel 21, a coolant recovery channel 22, a coolant Lc, a pump 23, a coolant tank 24, a radiator 25, a filter 26 and a coolant pipe line 27.

Furthermore, as shown in the figure, the coolant supply channel 21 and the coolant recovery channel 22 are respectively disposed at two ends of the coolant pipe line 27. The filter 26, the radiator 25, the coolant tank 24, the pump 23 and the coolant supply channel 21 are provided on the coolant pipe line 27 in sequence from the coolant recovery channel 22 in the circulation direction. The filter 26 is used to filter out foreign matters such as solder scraps and dust in the coolant Lc, and the radiator 25 is used to dissipate heat from the coolant Lc. For example, the coolant Lc can be cooled through a meandering pipe line and a plurality of heat dissipation fins. A fan for generating forced convection may be used to improve the heat dissipation effect.

In addition, the coolant tank 24 is used to store the coolant Lc for circulation, and the pump 23 is used to pump the coolant Lc so that the coolant Lc is forcibly circulated. The switch module 4 may be an electromagnetic control valve, which includes two inlet ends 41 and one outlet end 42. The gas supply module 3 of this embodiment includes a gas pressure source channel 32, one end of which is communicated with a gas pressure source Sa, and the other end of which is communicated with one of the two inlet ends 41 of the switch module 4. The coolant supply channel 21 of the coolant circulation module 2 is communicated with the other of the two inlet ends 41 of the switch module 4. On the other hand, the outlet end 42 of the switch module 4 is communicated with the inlets Sin. The switch module 4 is controlled to switch connection of the inlets Sin to the coolant supply channel 21 or the gas pressure source channel 32.

Moreover, the main controller 5 shown in the figure can be used for controlling operation of the entire electronic device testing apparatus, including the feeding process, the testing process, the dispensing process, the discharging process, the temperature controlling process and the like. The main controller 5 may be an industrial computer including a processor, a memory, storage media and other computer hardware components. The main controller 5 is electrically connected to the coolant circulation module 2, the gas supply module 3 and the switch module 4 and can be used to control the switch module 4 so that the inlets Sin are connected to the coolant supply channel 21 with the coolant Lc being supplied into the chip socket S by the coolant circulation module or connected to the gas pressure source channel 32 with a purge gas being supplied into the chip socket S by the gas supply module 3.

Reference is made to FIG. 1, FIG. 2A and FIG. 2B. FIG. 2A is a schematic diagram showing supplying of a coolant according to a preferred embodiment of the present invention, and FIG. 2B is a schematic diagram showing supplying of a purge gas according to a preferred embodiment of the present invention. The electronic device testing apparatus of this embodiment further includes a pressing head Ph and a test socket SI. The chip socket S is formed on the upper surface of the test socket SI, and the pressing head Ph is arranged above the test socket SI and can be controlled by the main controller 5 to be selectively moved toward or away from the test socket SI.

The testing and cooling process of the electronic device testing apparatus in this embodiment will be described in detail. First, an electronic device C to be tested is transferred and placed into the chip socket S by the pressing head Ph. At this time, a cooling space Sc is defined by the lower surface of the electronic device, the bottom surface of the chip socket S and the inner peripheral wall face of the chip socket S, as shown in FIG. 2A. As shown in the figure, in the cooling space Sc, the solder ball contacts Cb on the lower surface of the electronic device C are brought into electrical contact with the pogo pins Sp on the bottom surface of the chip socket S since the pressing head Ph keeps pressing the electronic device C, and the inlets Sin and the outlets Sout are communicated with the cooling space Sc.

Next, the main controller 5 activates the pump 23 and controls the switch module 4 so that the inlets Sin are connected to the coolant supply channel 21. After the pump 23 is activated, the coolant Lc is drawn from the coolant tank 24 by the pump 23 and supplied into the cooling space Sc through the coolant supply channel 21 and the inlets Sin. At this time, due to the continuous operation of the pump 23, the coolant Lc is continuously pumped to the cooling space Sc, the entire cooling space Sc is gradually filled with the coolant Lc, and the coolant Lc flows to the outlets Sout and then flows into the coolant recovery channel 22, as shown in FIG. 2A.

The coolant Lc flowing into the coolant recovery channel 22 passes through the filter 26 and the radiator 25 in sequence and finally returns to the coolant tank 24, thereby forming a circulation loop of the coolant Lc. The filter 26 filters out foreign matters such as solder scraps or dust entrained in the coolant Lc. The radiator 25 dissipates heat of the coolant Lc by means of heat exchange. In other embodiments, for example, during the low temperature test, the radiator 25 can be replaced with a cooler for actively cooling the coolant Lc so as to ensure that the electronic device is kept in a low temperature testing environment.

Then, the electronic device C can be tested, and during execution of the test, the pump 23 continues to operate so that the coolant Lc passes through the pogo pins Sp in the chip socket S and the solder ball contacts Cb of the electronic device C and continuously takes away the heat generated during the test. As such, the pogo pins Sp, the solder ball contacts Cb and even the electronic device C are cooled.

When the test is completed, the main controller 5 stops the operation of the pump 23, that is, the coolant circulation module 2 stops supplying the coolant Lc into the cooling space Sc. Next, the main controller 5 controls the switch module 4 so that the inlets Sin are connected to the gas pressure source channel 32. At this time, since the gas pressure source Sa supplies air having a pressure higher than the atmospheric pressure, the supplied air serving as a purge gas flows into the cooling space Sc and urges the residual coolant Lc out of the cooling space Sc so that the residual coolant Lc flows into the coolant recovery channel 22 through the outlets Sout for recycling when the switch module 4 is switched, as shown in FIG. 2B.

After the gas supply module 3 continues to supply the purge gas into the chip socket S for a period of time, the entire chip socket S (including the pogo pins Sp) and the lower surface of the electronic device C (including the solder ball contacts Cb) are cleaned. Finally, the pressing head Ph can pick up the tested electronic device C from the chip socket S and place another electronic device C to be tested into the chip socket S. In this embodiment, the coolant Lc is a non-conductive heat conducting liquid such as 3M™ Novec™ Engineered Fluid which would not cause a short circuit between the pogo pins Sp or a short circuit between the solder ball contacts Cb.

Figure 3A:
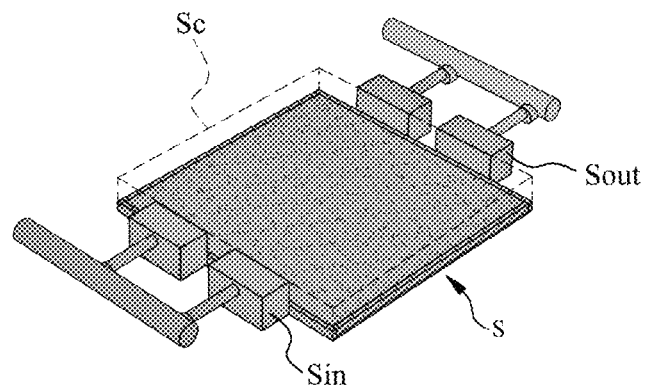
FIG. 3A is a schematic diagram of a first embodiment of a coolant circulation module of the present invention.
Figure 3B:
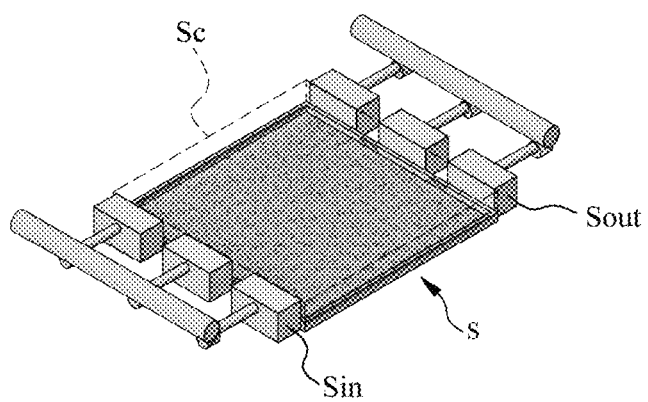
FIG. 3B is a schematic diagram of a second embodiment of the coolant circulation module of the present invention.

Reference is made to FIGS. 3A and 3B. FIG. 3A is a schematic diagram of a first embodiment of the coolant circulation module of the present invention, and FIG. 3B is a schematic diagram of a second embodiment of the coolant circulation module of the present invention. The first and second embodiments of the coolant circulation module of the present invention will be described below. The first embodiment adopts two inlets Sin and two outlets Sout, which are respectively disposed on two opposite side walls of the chip socket S. The second embodiment adopts three inlets Sin and three outlets S out, which are respectively disposed on the two opposite side walls of the chip socket S.

Figure 4A:
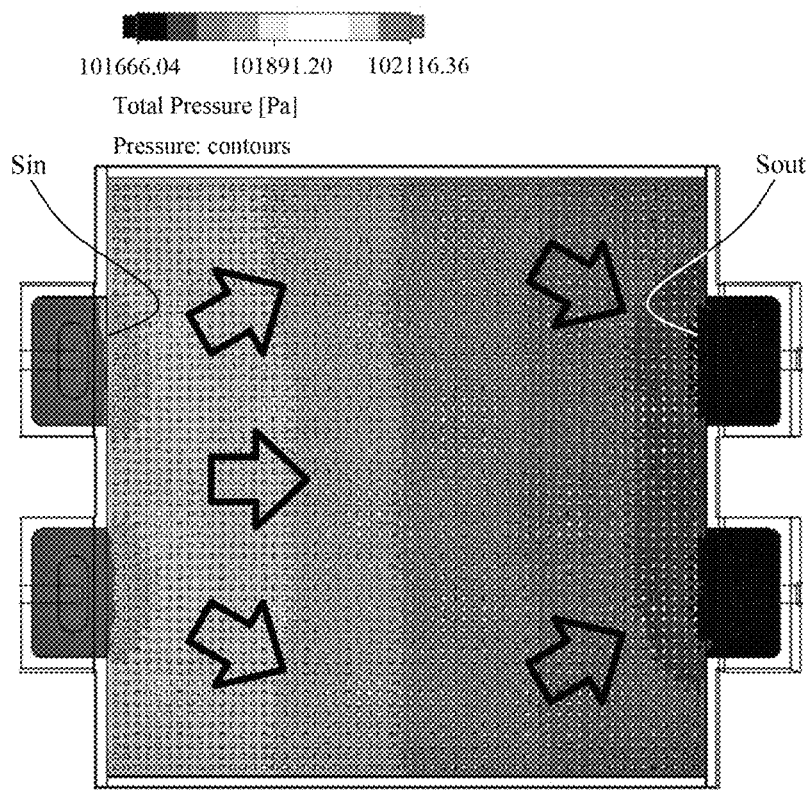
FIG. 4A is an analysis diagram of the fluid pressure of the coolant according the first embodiment of the coolant circulation module of the present invention.
Figure 4B:
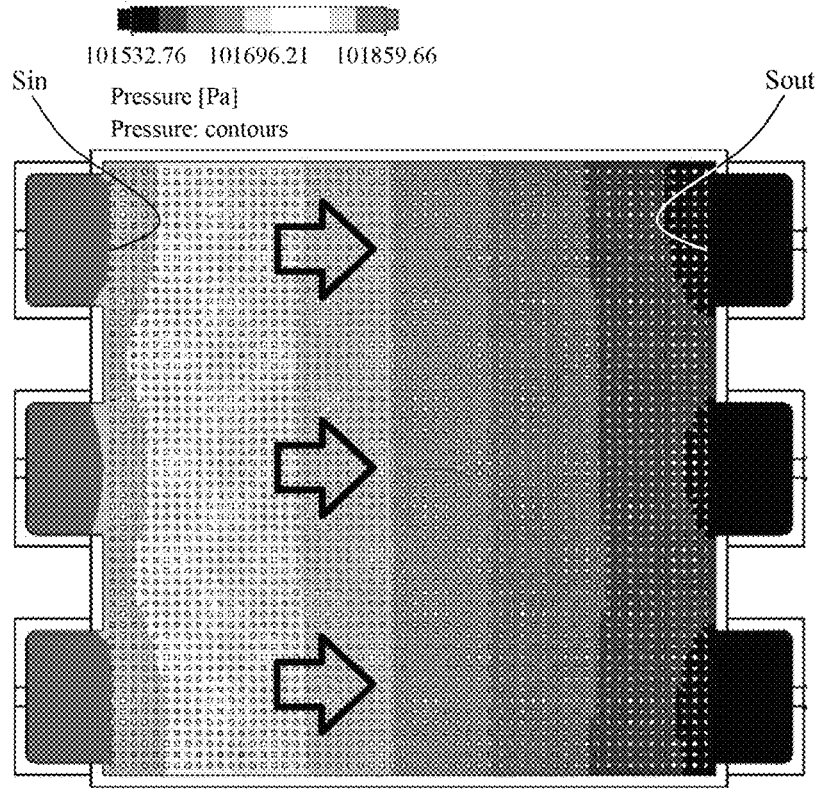
FIG. 4B is an analysis diagram of the fluid pressure of the coolant according the second embodiment of the coolant circulation module of the present invention.

Results of computer simulation of the first and second embodiments are shown in FIG. 4A, FIG. 4B, FIG. 5A and FIG. 5B. According to the second embodiment having three inlets and three outlets, the fluid pressure decreases very uniformly in the flow direction, as shown in FIG. 4B. In contrast, according to the first embodiment having two inlets and two inlets, the fluid pressure is higher at the inlets Sin and is lower at the outlets Sout, and the fluid pressure does not decrease uniformly.

Figure 5A:
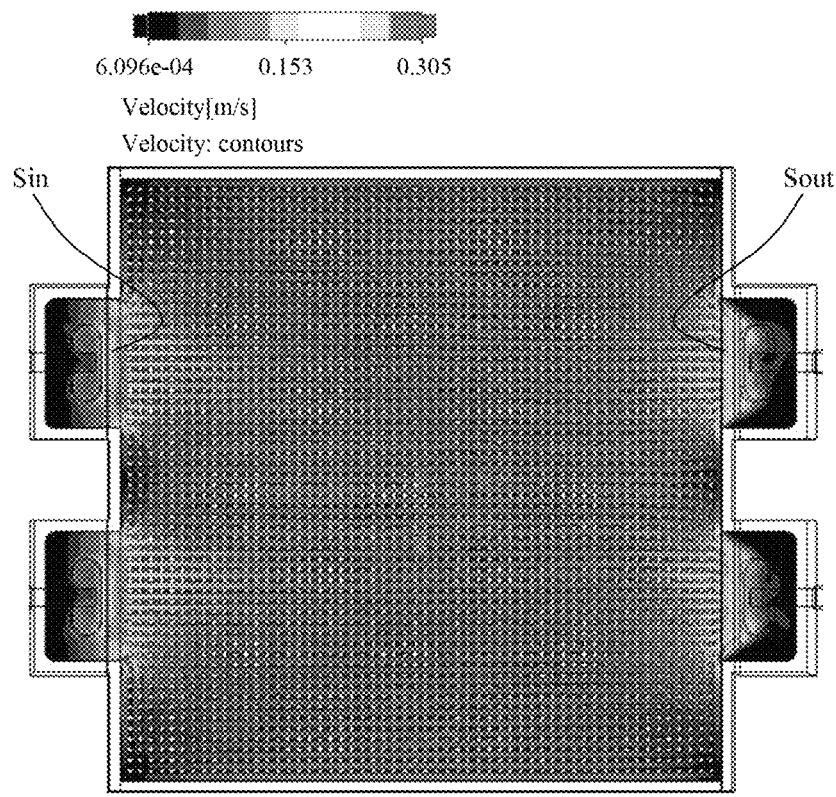
FIG. 5A is an analysis diagram of the velocity of the coolant according the first embodiment of the coolant circulation module of the present invention.
Figure 5B:
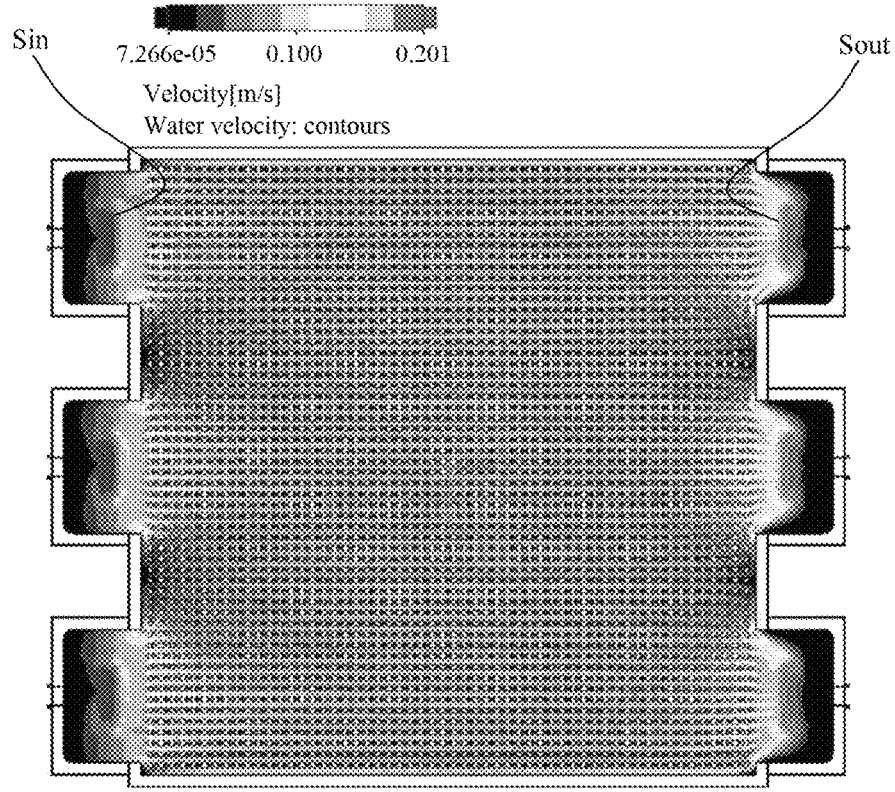
FIG. 5B is an analysis diagram of the fluid velocity of the coolant according the second embodiment of the coolant circulation module of the present invention.

As shown in FIG. 5B, in the second embodiment, the fluid velocity is uniform, and the fluid velocity is slightly lower only in the area between two inlets Sin and the area between two outlets S out. As shown in FIG. 5A, in the first embodiment, the fluid velocity is lower at four corners, and in the area between the inlets and the area between the outlets. It means that the coolant has bad fluidity at the four corners.

Figure 6:
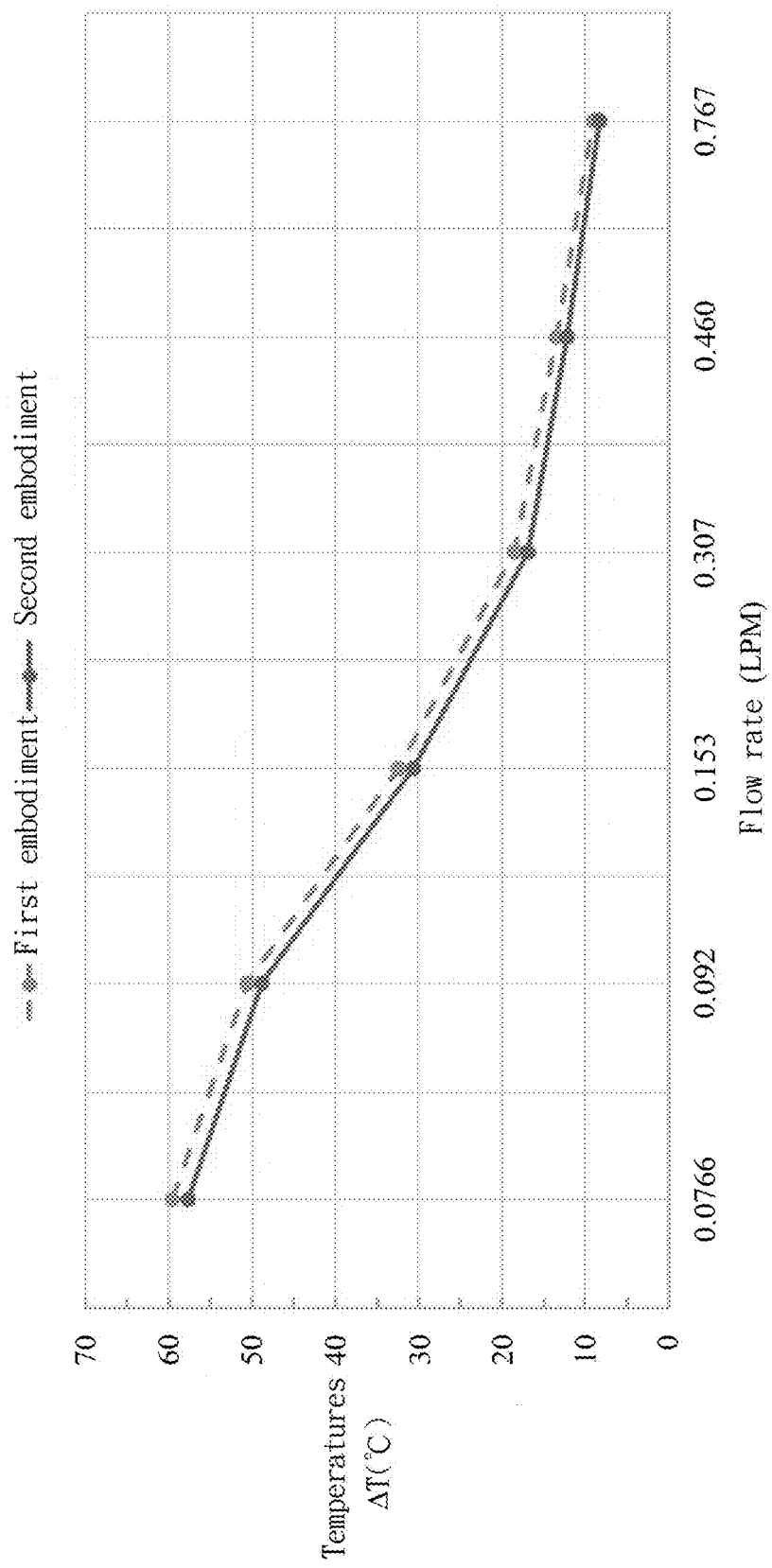
FIG. 6 is a diagram showing the relationship between the flow rate of the coolant and the temperature rise of the pogo pins according to the first and second embodiments of the coolant circulation module of the present invention.

Reference is made to FIG. 6, which is a diagram showing the relationship between the flow rate of the coolant and the temperature rise of the pogo pins according to the first and second embodiments of the coolant circulation module of the present invention. As shown in FIG. 6, the upper dotted line shows the relationship between the temperature rise and the flow rate in the first embodiment. When the flow rate of the coolant is about 0.092 LPM, the first embodiment can maintain the temperature rise of the pogo pins and the solder ball contacts at about 50 degrees. On the other hand, the lower solid line shows the relationship between the temperature rise and the flow rate in the second embodiment. It can be clearly seen from the figure that the second embodiment having three inlets and three outlets has a better cooling effect.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. A pogo pin cooling system, which is at least used for cooling a plurality of pogo pins in a chip socket, the chip socket comprising at least one inlet and at least one outlet, the system comprising:
   a coolant circulation module, including at least one coolant supply channel, at least one coolant recovery channel and a liquid coolant, the at least one coolant recovery channel being communicated with the at least one outlet,
   a gas supply module, including a gas pressure source channel, wherein one end of the gas pressure source channel being communication with a gas pressure source; and
   a switch module, including two inlet ends and an outlet end, wherein the other end of the gas pressure source channel is communicated with one of the two inlet ends of the switch module, the at least one coolant supply channel is communicated with the other of the inlet ends of the switch module, and the outlet end of the switch module being communicated with the at least one inlet;
   wherein when an electronic device is accommodated in the chip socket, the switch module is controlled to connect the at least one inlet to the at least one coolant supply channel, the coolant circulation module supplies the liquid coolant into the chip socket through the at least one coolant supply channel and the at least one inlet, and the liquid coolant passes through the pogo pins and then flows into the at least one coolant recovery channel through the at least one outlet; in response to the coolant circulation module stopping the supply of the liquid coolant, the switch module is controlled to connect the at least one inlet to the gas pressure source channel, the gas supply module supplies a purge gas into the chip socket through the at least one inlet to urge the liquid coolant toward the at least one coolant recovery channel;

wherein the coolant circulation module further includes a pump, a radiator and a coolant pipe line; the at least one coolant supply channel and the at least one coolant recovery channel are respectively disposed at two ends of the coolant pipe line; the pump and the radiator are provided on the coolant pipe line.

2. The pogo pin cooling system of claim 1, wherein the coolant circulation module further includes a coolant tank and a filter; the coolant tank and the filter are provided on the coolant pipe line.

3. The pogo pin cooling system of claim 1, wherein when the electronic device is accommodated in the chip socket, a cooling space into which the liquid coolant is supplied by the coolant circulation module is defined by a lower surface of the electronic device, a bottom surface of the chip socket and an inner peripheral wall face of the chip socket.

4. An electronic device testing apparatus comprising the pogo pin cooling system of claim 1 and a main controller, wherein the main controller is electrically connected to the coolant circulation module, the main controller controls the coolant circulation module to supply the liquid coolant into the chip socket.

5. The electronic device testing apparatus of claim 4, further comprising a pressing head and a test socket, wherein the chip socket is formed on an upper surface of the test socket, the pressing head is arranged above the test socket and is controlled by the main controller to be selectively moved toward or away from the test socket; when the electronic device is accommodated in the chip socket, the controller controls the pressing head to press the electronic device.

6. A pogo pin cooling method, comprising the steps of:
(A) placing an electronic device into a chip socket, a bottom surface of the chip socket being provided with at least one pogo pin;
(B) controlling a switch module to enable a coolant circulation module to supply a liquid coolant into the chip socket through at least one coolant supply channel, wherein the coolant passes through the at least one pogo pin and then flows into at least one coolant recovery channel; the liquid coolant is supplied into the chip socket by a pump and passes through a radiator;
(C) stopping supplying the liquid coolant into the chip socket; and
(D) controlling the switch module to enable a gas supply module to supply a purge gas into the chip socket to urge the liquid coolant toward the at least one coolant recovery channel;

wherein the switch module includes two inlet ends and an outlet end, the gas supply module is in communication with one of the two inlet ends of the switch module; the coolant circulation module is in communication with the other inlet end of the switch module; the outlet end of the switch module is in communication with chip socket.

7. The pogo pin cooling method of claim 6, wherein in the step (A), a cooling space is defined by a lower surface of the electronic device, the bottom surface of the chip socket and an inner peripheral wall face of the chip socket; in the step (B), the liquid coolant is supplied into the cooling space through the at least one coolant supply channel.

8. The pogo pin cooling method of claim 7, wherein in the step (B), the liquid coolant is drawn from a coolant tank by the pump and then supplied into the cooling space through the at least one coolant supply channel; and the liquid coolant flowing into the at least one coolant recovery channel passes through a filter and the radiator in sequence and then flows into the coolant tank.

\* \* \* \* \*